(12) United States Patent
Shao et al.

(10) Patent No.: US 10,185,420 B2
(45) Date of Patent: Jan. 22, 2019

(54) DISPLAY PANEL AND DISPLAY DEVICE WITH NARROW BEZEL

(71) Applicants: Shanghai AVIC Optoelectronics Co., Ltd., Shanghai (CN); Tianma Micro-Electronics Co., Ltd., Shenzhen (CN)

(72) Inventors: Wantong Shao, Shanghai (CN); Huijun Jin, Shanghai (CN)

(73) Assignees: Shanghai AVIC Optoelectronics Co., Ltd., Shanghai (CN); Tianma Micro-Electronics Co., Ltd., Shenzhen (CN)

( * ) Notice: Subject to any disclaimer, the term of this patent is extended or adjusted under 35 U.S.C. 154(b) by 0 days.

(21) Appl. No.: 15/981,923

(22) Filed: May 17, 2018

(65) Prior Publication Data

US 2018/0267641 A1   Sep. 20, 2018

Related U.S. Application Data

(63) Continuation of application No. 15/175,508, filed on Jun. 7, 2016, now Pat. No. 10,001,850.

(30) Foreign Application Priority Data

Dec. 25, 2015   (CN) .......................... 2015 1 0996614

(51) Int. Cl.
 G06F 3/041     (2006.01)
 G09G 3/20      (2006.01)
 H01L 27/32     (2006.01)

(52) U.S. Cl.
 CPC ............ *G06F 3/041* (2013.01); *G06F 3/0416* (2013.01); *G09G 3/20* (2013.01); *G06F 3/0412* (2013.01); *G06F 2203/04103* (2013.01); *G09G 2300/0426* (2013.01); *H01L 27/323* (2013.01); *H01L 27/3276* (2013.01)

(58) Field of Classification Search
 CPC ........... G06F 2203/04103; G06F 3/041; G06F 3/0412; G06F 3/0416
 See application file for complete search history.

(56) References Cited

U.S. PATENT DOCUMENTS

| 8,368,630 | B2 * | 2/2013 | Lee ................... | G02F 1/134309 |
| | | | | 345/104 |
| 2006/0132463 | A1 * | 6/2006 | Lee ...................... | G06F 3/0412 |
| | | | | 345/173 |
| 2010/0066922 | A1 * | 3/2010 | Kumada .............. | G09G 3/3677 |
| | | | | 348/790 |

* cited by examiner

*Primary Examiner* — Roy P Rabindranath
(74) *Attorney, Agent, or Firm* — Kilpatrick Townsend & Stockton LLP (57) ABSTRACT

A display panel and a display device are disclosed. The display panel includes at least two types of signal lines, at least two types of connection lines and a driver chip. At least two types of signal terminals are provided on the drive chip. The at least two types of signal terminals are electrically connected to the at least two types of signal lines through corresponding types of the connection lines, respectively. In the at least two types of signal terminals, at least a part of a first type of signal terminals and at least a part of a second type of signal terminals are alternately and separately arranged. The display panel and the display device have a frame with reduced size.

19 Claims, 7 Drawing Sheets

DISPLAY PANEL AND DISPLAY DEVICE WITH NARROW BEZEL

CROSS-REFERENCES TO RELATED APPLICATIONS

This application is a continuation of U.S. application Ser. No. 15/175,508, filed on Jun. 7, 2016, which claims priority to Chinese Application No. CN201510996614.4 filed on Dec. 25, 2015, which are herein incorporated by reference in their entireties.

TECHNICAL FIELD

The present application relates to the field of display technologies, in particular to a display panel and a display device.

BACKGROUND

With the rapid development of display technologies, display panels and display devices including the display panels are widely used. A display region of an existing display panel is provided with a plurality of types of signal lines, and a non-display region of the existing display panel is provided with a driver chip. All signal lines are electrically connected to respective signal terminals of the driver chip through respective connection lines on the non-display region so as to apply respective signals to the respective signal lines through the signal terminals, thereby realizing display function, touch function and pressure-sensing function and so on.

Since a width of a region occupied by the signal lines is larger than a width of the driver chip, and the connection lines are electrically insulated from each other (that is, a gap is present between any two adjacent connection lines of the connection lines). As a result, the connection lines are configured to be bent relative to the signal lines (that is, the connection lines take form of folded lines relative to the signal lines) such that the signal lines can be electrically connected to respective signal terminals of the driver chip. A large number of the signal lines also cause a large number of the connection lines. In general, the driver chip has a relative small width, so that it is necessary to elongate the length of the connection lines to realize the electrical insulation between the connection lines in the case of the large number of the connection lines.

Since the same type of signal terminals on the driver chip corresponding to the same type of signal lines are adjacent to each other, the same type of connection lines corresponding to the same type of signal lines are also adjacent to each other. As a result, a region occupied by the same type of connection lines has a relatively small width. Therefore, this electrical insulation between the connection lines can only be realized by elongating the length of the connection lines, so that the region occupied by the connection lines becomes large. Further, since the connection lines are arranged in the non-display region of the display panel, this causes a large length of the non-display region. In other words, large-sized frames of the display panel and of the display device including the display panel are caused.

SUMMARY

Embodiments provide a display panel and a display device, to solve the problem in the related art that the frame of the display panel and the display device has a relatively large size.

Embodiments employ the following technical solution.

In a first aspect, an embodiment provides a display panel, which includes at least two types of signal lines, at least two types of connection lines and a driver chip. At least two types of signal terminals are provided on the drive chip. The at least two types of signal terminals are electrically connected to the at least two types of signal lines through corresponding types of the connection lines, respectively. At least a part of a first type of signal terminals and at least a part of a second type of signal terminals are alternately and separately arranged.

In a second aspect, an embodiment provides a display device, which includes a display panel provided according the first aspect.

According to the display panel and the display device provided in the embodiments, at least two types of signal terminals are provided on the drive chip. The at least two types of signal terminals are electrically connected to the at least two types of signal lines through corresponding types of the connection lines, respectively. At least a part of a first type of signal terminals and at least a part of a second type of signal terminals are alternately and separately arranged, such that at least a part of signal terminals from the same type of signal terminals are not adjacent to each other. As a result, a distance between two edge signal terminals located at both ends of the same type of signal terminals is increased. When a type of signal lines are electrically connected to a type of signal terminals through a type of connection lines, since the distance between two edge signal terminals located at both ends of the same type of signal terminals is increased, a dimension of a region prepared for the same type of connection lines (i.e. a direction perpendicular to the connection line between the two edge signal terminals) is increased in a lateral direction. Hence, it is not necessary for a long length of the connection line in order to realize the electrical insulation between the connection lines, i.e. the length of the connection line is reduced. Since the length of the connection line is reduced, the dimension of the non-display region occupied by the connection lines (i.e. a direction parallel to the connection line between the two edge signal terminals) is decreased in a longitudinal direction, hence decreasing the dimension of the non-display region in the longitudinal direction, that is, decreasing the size of the frame of the display panel.

DESCRIPTION OF DRAWINGS

Other features, objects and advantages of the present disclosure will become more clearly by referring to the detailed description to the non-limited embodiments made by the following drawings.

DETAILED DESCRIPTION OF THE EMBODIMENTS

The present disclosure will be described below in detail in conjunction with the accompanying drawings and embodiments. It is appreciated that the embodiments described herein are only used for explaining the present disclosure, but not limiting the present disclosure. Also, for the convenience of description, the accompanying drawings illustrate only the relevant parts of the present disclosure not all contents thereof.

An Embodiment Provides a Display Panel.

Figure 1A:
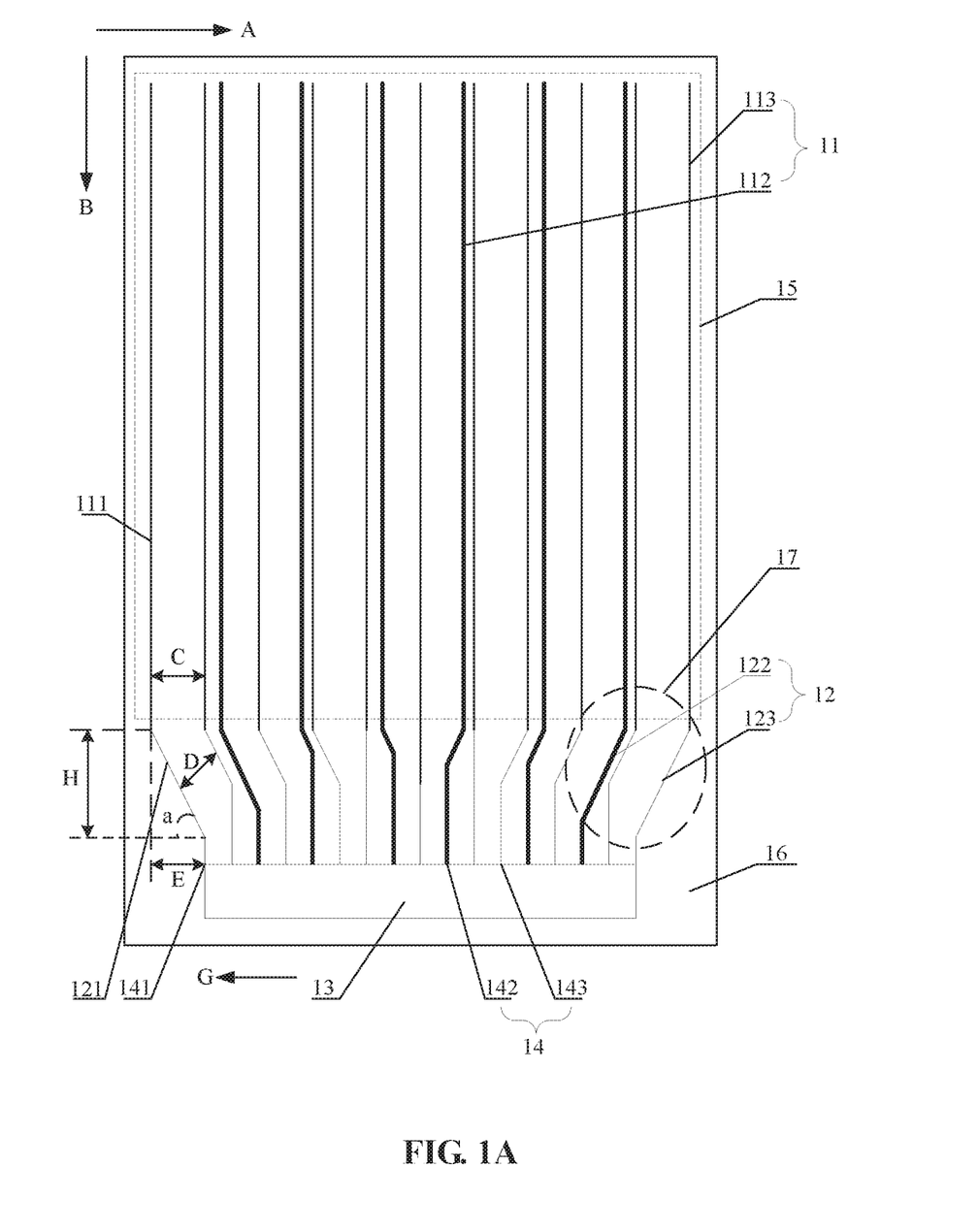
FIG. 1A is a top schematic view showing the structure of a display panel according to an embodiment.

FIG. 1A is a top schematic view showing the structure of a display panel according to an embodiment. As shown in FIG. 1A, the display panel includes at least two types of signal lines 11, at least two types of connection lines 12 and a driver chip 13.

At least two types of signal terminals 14 are provided on the driver chip 13, and the at least two types of signal terminals 14 are electrically connected to the at least two types of signal lines 11 through corresponding types of the connection lines 12, respectively. At least a part of a first type of signal terminals and at least a part of a second type of signal terminals are alternately and separately arranged.

According to the display panel provided in the embodiment, in the at least two types of signal terminals 14 disposed on the driver chip 13, at least a part of a first type of signal terminals and at least a part of a second type of signal terminals are alternately and separately arranged, such that at least a part of signal terminals 14 from the same type of signal terminals 14 are no longer adjacent to each other (that is, a type of signal terminals 14 are arranged to be separated by another type of signal terminals). Since the space between adjacent signal terminals is identical, in the display panel provided in the embodiment, a type of signal terminals 14 are arranged to be separated by another type of signal terminals 14, so that a distance between two edge signal terminals 14 (that is, the first and the last signal terminals 14) from the same type of signal terminals 14 (i.e. indicated by A direction as shown in FIG. 1A) is increased in a lateral direction, as compared with the technical solution in the related art that the signal terminals from the same type of are adjacent to each other. When a type of signal lines 11 are electrically connected to a type of signal terminals 14 through a type of connection lines 12, since the distance between two adjacent signal terminals of the type of signal terminals 14 is increased, a dimension of a region prepared for the type of connection lines 12 is increased in the lateral direction. As a result, it is not necessary to for the connection line to be too long in order to realize the electrical insulation between the connection lines. That is, the length of the connection line (i.e., the length of the connection line in the B direction shown in FIG. 1A) is reduced in the longitudinal direction. Since the length (i.e., height) of the connection line is reduced, the dimension of a non-display region occupied by the connection lines 12 in a longitudinal direction (i.e. the B direction as shown in FIG. 1A) can be decreased, hence decreasing the dimension of the non-display region in the longitudinal direction, that is, reducing the size of the frame of the display panel.

As shown in FIG. 1A, in order to better realize the electrical insulation between two adjacent lines (such as two adjacent signal lines 11 or two adjacent connection lines 12) and facilitate the manufacturing of the display panel, in a process for designing the display panel, the display panel is generally designed as the following structure: as for the same type of signal lines 11, the distance between any two adjacent signal lines 11 is identical. As for all the types of connection lines 12, the distance between any two adjacent connection lines 12 is identical. As for all the types of signal terminals, the distance between any two adjacent signal terminals is identical. The connection line 12 takes a form of a folded line (i.e. the folded line enclosed by a circular region as shown in FIG. 1A).

Figure 1B:
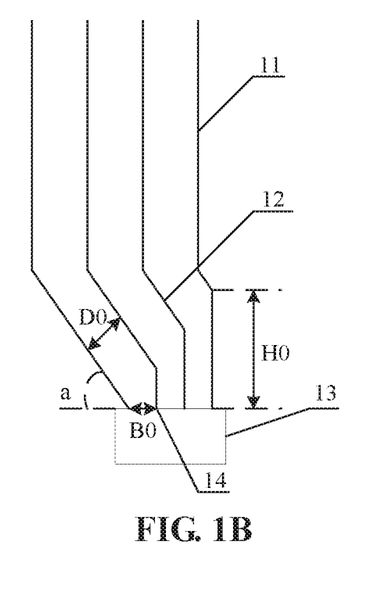
FIG. 1B is a top schematic view showing the partial structure of a display panel in which same type of signal terminals are adjacently arranged according to an embodiment.

As shown in FIG. 1A, a first region 15 is defined as a display region of the display panel; a second region 16 is defined as a non-display region of the display panel, i.e. a frame. The dimension of the frame in a longitudinal direction (i.e., the direction B) is correlated with the dimension of the folded line portions 17 of all the connection lines 12 in the longitudinal direction. The larger the dimension of the folded line portion of the connection line 12 in the longitudinal direction is, the larger the dimension of the frame in the longitudinal direction is. The number of a type of signal lines may be different from the number of the other type of signal lines. Accordingly, the number of a type of connection lines may be different from the number of the other type of connection lines. As a result, the folded line portions of different types of connection lines 12 have different dimensions in the longitudinal direction. Since a width of a region occupied by all the signal lines 11 is larger than a width of a driver chip 13, and a certain gap is required for all the connection lines to realize the electrical insulation, the connection lines 12 are arranged to be bent relative to the signal lines 11 (i.e. the connection line 12 takes a form of folded line relative to the signal line 11), so that the signal lines 11 can be electrically connected to respective signal terminals 11 of the driver chip 13. It should be understood that the folded line portions of two adjacent connection lines 12 have lengths different from each other. FIG. 1B is a top schematic view showing the partial structure of a display panel in which the signal terminals from a type of signal terminals are adjacently arranged according to an embodiment. The signal terminals 14 in a structure as shown in FIG. 1A are a same type of signal terminals. As shown in FIG. 1B, given that a vertical distance between two adjacent signal terminals is B0; a vertical distance between two adjacent connection lines is D0; an angle of the connection line 12 relative to a folded line distribution of the signal line 11 is α; a height of the folded line portion of the connection line 12 is H0; and the number of this type of connection lines is N, then, H0 can be obtained according to the following formula: $H0=(N-1)*\sqrt{D0^2-B0^2}=(N-1)*\cos\alpha$. From this formula, it can be known that the lengths of the folded line portions are increased as the number of the connection lines 12 increases. As a result, the more number of the connection lines from the same type of connection lines 12 indicates the larger dimension of the folded line portions in the longitudinal direction, i.e. the direction B. In addition, since the size of the dimension of the frame of the display panel in the longitudinal direction is determined by the maximal value of the dimensions of the folded line portions of all types of connection lines 12 in the longitudinal direction, and hence the size of the dimension of the frame in the longitudinal direction is determined by the dimensions of the folded line portions of the type of the connection lines having the maximal number of connection lines in the longitudinal direction.

As shown in FIG. 1A, it is assumed that: two adjacent connection lines 11 of the same type of connection lines 11 have a vertical distance C; two adjacent connection line 12 have a vertical distance D; a vertical distance between the edge signal line 111 connected to an edge connection line 121 of the same type of connection lines 12 and a corresponding edge signal terminal 141 is E; the dimension of the folded line portion of the same type of connection lines 12 in the longitudinal direction is H. Therefore, it can be known form an geometrical relationship that H=E*tan α=E*tan (arcsin(D/C)).

The value of H obtained by calculation is a dimension of the folded lines portion of one type of connection lines 12 in the longitudinal direction. It is well known from the above formula that the dimension of the folded line portion of each of the types of connection lines 12 in the longitudinal direction can be obtained by calculation.

The dimension of the frame in the longitudinal direction, i.e. the direction B, is determined by the maximal value of H, where H represents the dimensions of the folded line portions of the all types of connection lines 12 in the longitudinal direction. If the dimension of the frame in the longitudinal direction is desired to be decreased, the value of H (in particularly the folded line portion of the connection line 12 in the longitudinal direction when H is the maximal value) should be decreased.

Since the value of the vertical distance C between two adjacent signal lines 11 of the same type of signal lines 11 and the value of the vertical distance D between two adjacent connection line 12 remain constant, it can be known from the formula H=E*tan α=E*tan(arcsin(D/C)), if the dimension H of the folded line portion of the connection line 12 in the longitudinal direction is decreased, the value of the vertical distance E between the edge signal line 111 and the edge signal terminal 141 should be decreased. In addition, since the arrangement of the signal lines 11 on the display panel remains unchanged (that is, the position of the edge signal line 111 remains unchanged), the position of the edge connection line 121 remains unchanged. As a result, if the value of the vertical distance between the edge signal line 111 connected to the edge connection line 121 and the corresponding edge signal terminal 141 is desired to be decreased, the edge signal terminal 14 should be moved to the edge (the G direction as shown in FIG. 1A) of the driver chip (that is, decreasing the vertical distance between the edge signal terminal 14 and the edge signal line 111).

According to the display panel provided in the embodiment, in the at least two types of signal terminals 14 provided on the driver chip, at least a part of a first type of signal terminals and at least a part of a second type of signal terminals are alternately and separately arranged such that a part of signal terminals 14 of the type of signal terminals 14 are no longer adjacent to each other. As compared with a case in the related art that the same type of signal terminals are arranged to be adjacent to each other, in the display panel provided by the embodiments, an edge signal terminal 141 of the at least part of different types of signal terminals 14 can be moved toward to the edge of the driver chip, so that the distance between the edge signal terminal 141 and the edge signal line 111 is decreased. The value of the dimension H of the folded line portions of the at least part of different types of connection lines 12 in the longitudinal direction is decreased, thereby decreasing the dimension of the frame in the longitudinal direction, that is, the dimension of the frame can be decreased.

It should be noted that the number of the types of signal lines included in the display panel can be any positive integer, which is larger than or equal to 2. Since the number of the types of connection lines and signal terminals are equal to the number of the types of the signal lines, the number of the types of connection lines can be any positive integer, which is larger than or equal to 2, and the number of the types of signal terminals can be any positive integer, which is larger than or equal to 2; and the number of the signal terminals arranged to be spaced apart can be any positive integer, which is larger than or equal to 2.

The structure of a display panel including two types of the signal terminals alternately and separately arranged is exemplarily illustrated as follows.

As shown in FIG. 1A, at least two types of signal lines 11 include: a plurality of first signal lines 112 and a plurality of second signal lines 113; at least two types of connection lines 12 include: a plurality of first connection lines 122 and a plurality of second connection lines 123; at least two type of signal terminals include: a plurality of first signal terminals 142 and a plurality of second signal terminals 143.

The first signal lines 112 are electrically connected to the first signal terminals 142 through the first connection lines 122; the second signal lines 113 are electrically connected to the second signal terminals 143 through the second connection lines 123.

At least a part of the first signal terminals 142 and at least a part of the second signal terminals 143 are alternately and separately arranged.

It should be noted that the thick lines and the thin lines in FIG. 1A are only illustrated to show the first signal lines 112 and the second signal lines 113, and the first connection liens 122 and the second connection lines 123. They are not intended to limit the degrees of thickness and thinness of the signal lines 11 and connection lines 12 on the display panel. The numbers of the first signal lines 112 and second signal lines 113 are only for illustration, and hence is not intended to be limiting. A space between the first signal line 112 and the second signal line 113, and a space between the first connection line 122 and the second connection line 123 are also illustrated for the description, and are not intended to be limiting.

The arrangement that at least a part of the first signal terminals 142 and at least a part of the second signal terminals 143 are alternately and separately arranged can be achieved by any one of manners as follows. The implementation of the arrangement of the signal terminals as an example is described below.

Figure 2:
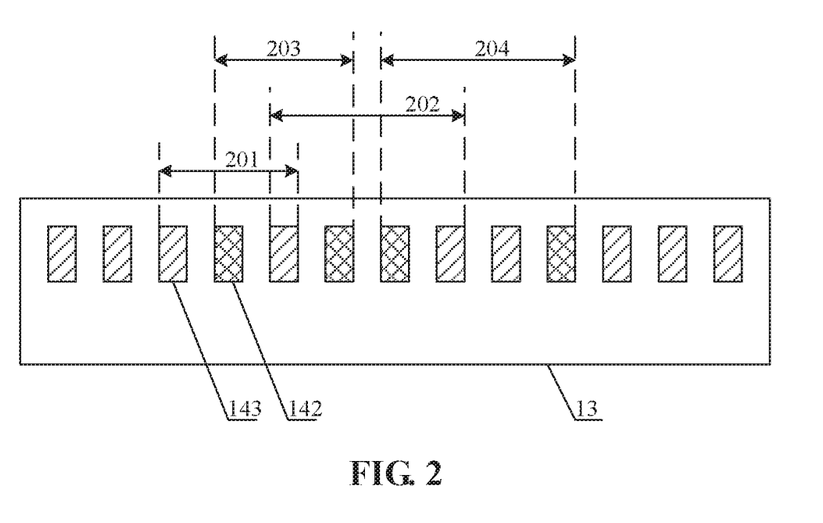
FIG. 2 is a top schematic view showing the structure of an implementation of distribution of signal terminals of a display panel according to an embodiment.

FIG. 2 is a top schematic view showing the structure of an implementation of arrangement of signal terminals of a display panel according to an embodiment. As shown in FIG. 2, all first signal terminals 142 are alternately arranged between second signal terminals 143.

As shown in FIG. 2, all the first signal terminals 142 are arranged between the plurality of second signal terminals 143, and the edge signal terminals belongs to the second signal terminals 143. In such arrangement, the number of the first signal terminals 142 is less than that of the second signal terminals 143. That is, in the arrangement provided in FIG. 2, all the type of signal terminals (i.e. all the first signal terminals 142) having a smaller number of signal terminals are arranged between the type of signal terminals having a larger number of signal terminals (i.e. the second signal terminals 143).

According to the arrangement of the signal terminals provided in FIG. 2, it is possible to move the edge signal terminals of the type of signal terminals having the larger number of signal terminals towards an edge of the driver chip 13, so that a vertical distance (i.e. the letter E as shown in FIG. 1A) between the edge signal terminal of the type of signal terminals having the larger number of signal terminals and an edge signal line connected to the edge signal terminal can be decreased, and hence the dimension of a non-display region occupied by the connection lines corresponding to the type of signal terminals having the larger number of signal terminals can be decreased in the longitudinal direction. Since the dimension of the frame in the longitudinal direction is determined by the dimension of the non-display-region occupied by the connection lines corresponding to the type of signal terminals having the maximal number of signal terminals in the longitudinal direction, in the implementation of the arrangement of the signal terminals provided in FIG. 2, the size of the frame can decreased in the longitudinal direction.

It should be noted that the number of the first signal terminals 142 located between two adjacent second signal terminals 143 can be any positive integer, for example, as shown by the numerical reference 201 in FIG. 2, the number of the first signal terminal 142 between two second signal terminals 143 is 1; as shown by the numerical reference 202 in FIG. 2, the number of the first signal terminals 142 between two second signal terminals 143 is 2. The number of the second signal terminal 143 between two adjacent first signal terminals 142 can be any positive integer, for example, as shown by the numerical reference 203 in FIG. 2, the number of the second signal terminal 143 between two first signal terminals 142 is 1; as shown by the numerical reference 204 in FIG. 2, the number of the second signal terminals 143 between two first signal terminals 142 is 2.

Figure 3:
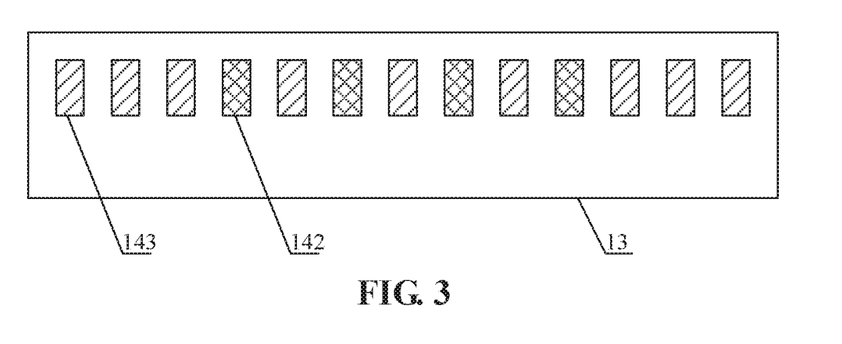
FIG. 3 is a top schematic view showing the structure of another implementation of arrangement of signal terminals of a display panel according to an embodiment.

FIG. 3 is a top schematic view showing the structure of another implementation of arrangement of terminals of a display panel according to an embodiment. As shown in FIG. 3, every two of the first signal terminals 142 are spaced from each other by one of the second signal terminals 143.

As shown in FIG. 3, every two of the first signal terminals 142 are spaced from each other by one of the adjacent second signal terminals 143, so that any two adjacent first signal terminals 142 is provided with one second signal terminal 143 therebetween. In such an arrangement, the number of the first signal terminals 142 is less than that of the second signal terminals 143. That is, in the arrangement of the signal terminals provided in FIG. 3, every two of the signal terminals from the type of signal terminals having a smaller number of signal terminals (i.e. the first signal terminals 142) are spaced from each other by one of the type of signal terminals having a larger number of signal terminals (i.e. the signal terminals 143).

In the arrangement of the signal terminals provided in FIG. 3, the edge signal terminal from the type of signal terminals having a larger number of signal terminals can be moved towards the edge of the driver chip 13, so that a vertical distance between the edge signal terminal of the type of signal terminals having a larger number of signal terminals and an edge signal line connected to the edge signal terminal, i.e. the distance E as shown in FIG. 1A, can be decreased, and further the dimension of a non-display region occupied by the connection lines corresponding to the type of signal terminals having the larger number of signal terminals can be decreased in the longitudinal direction. Since the dimension of the frame in the longitudinal direction is determined by the dimension of the non-display region occupied by the connection lines corresponding to the type of signal terminals having the maximal number of signal terminals in the longitudinal direction, the dimension of the frame in the longitudinal direction can be decreased according to the implementation of the arrangement of the signal terminals provided in FIG. 3. In addition, every two of the first signal terminals 142 are spaced from each other by one of the second signal terminals 143 such that a distance between the first signal terminals 142 is enlarged, as a result, when the signal lines are electrically connected to first signal terminals 142 through the connection lines, the space between the connection lines is also enlarged, thereby simplifying the manufacturing process of the display panel.

It should be noted that every two of the first signal terminals 142 can be spaced from each other by any of the second signal terminals 143, that is, the first signal terminals 142 can be located at any region.

Figure 4:
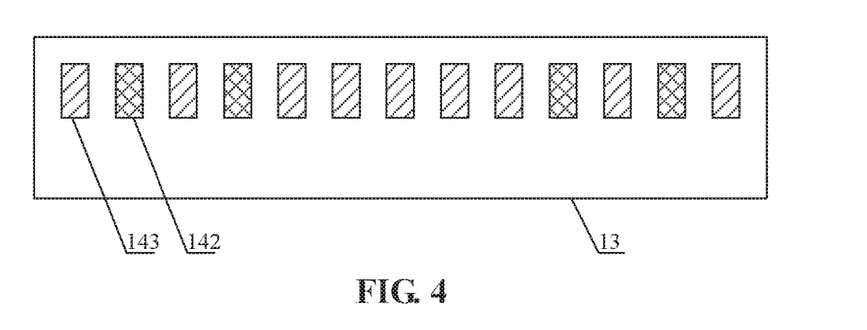
FIG. 4 is a top schematic view showing the structure of another implementation of arrangement of signal terminals of a display panel according to an embodiment.

FIG. 4 is a top schematic view showing the structure of another implementation of arrangement of signal terminals of a display panel according to an embodiment. As shown in FIG. 4, any two of the first signal terminals 142 are spaced from each other by a part of second signal terminals 143, and in each of the both sides of the driver chip 13, a part of the first signal terminals 142 and a part of the second signal terminals 143 are alternately arranged separately, and in the middle of the driver chip 13, a part of the second signal terminals are arranged.

As shown in FIG. 4, any two of the first signal terminals 142 are spaced from each other by a part of second signal terminals 143, and in each of the both sides of the driver chip 13, a part of the first signal terminals 142 and a part of the second signal terminals 143 are alternately arranged separately, and in the middle of the driver chip 13, a part of the second signal terminals are arranged. In such an arrangement, the number of the first signal terminals 142 is less than that of the second signal terminals 143, that is, in the arrangement of the signal terminals provided in FIG. 4, a smaller number of signal terminals are arranged separately by a larger number of signal terminals, and all the smaller number of signal terminals 142 and the larger number of signal terminals 143 from both ends of all the second signal terminals 143 are alternately and separately arranged.

In the arrangement of the signal terminals provided in FIG. 4, the edge signal terminal from the type of signal terminals having a larger number of signal terminals can be moved towards the edge of the driver chip 13, so that a vertical distance between the edge signal terminal of the type of signal terminals having a larger number of signal terminals and an edge signal line connected to the edge signal terminal, i.e. the distance E as shown in FIG. 1A, can be decreased, and further the dimension of a non-display region occupied by the connection lines corresponding to the type of signal terminals having the larger number of signal terminals can be decreased in the longitudinal direction. Since the dimension of the frame in the longitudinal direction is determined by the dimension of the non-display region occupied by the connection lines corresponding to the type of signal terminals having the maximal number of signal terminals in the longitudinal direction, the dimension of the frame in the longitudinal direction can be decreased according to the implementation of the arrangement of the signal terminals provided in FIG. 4. In addition, every two of the first signal terminals 142 are spaced from each other by one of the second signal terminals 143 such that a distance between the first signal terminals 142 is enlarged. As a result, when the signal lines are electrically connected to first signal terminals 142 through the connection lines, the space between the connection lines is also enlarged, thereby simplifying the manufacturing process of the display panel. In addition, as compared with the embodiment as shown in FIG. 3, in the present embodiment of FIG. 4, any two of the first signal terminals 142 are spaced from each other by a part of second signal terminals 143, and in each of the both sides of the driver chip 13, a part of the first signal terminals 142 and a part of the second signal terminals 143 are alternately arranged separately, and in the middle of the driver chip 13, a part of the second signal terminals are arranged. When the signal lines are electrically connected to the first signal terminals 142 through the connection lines, only a half number of connection lines rather than all the connection lines are adjacent to each other (since a half number of first signal terminal are located at each of both ends of all the first signal terminals 142, the half number of signal terminals are adjacent to each other, and hence, the half number of connection lines are adjacent to each other). Therefore, the number of connection lines adjacent to each other is decreased, thereby simplifying the manufacturing process of the display panel.

Figure 5:
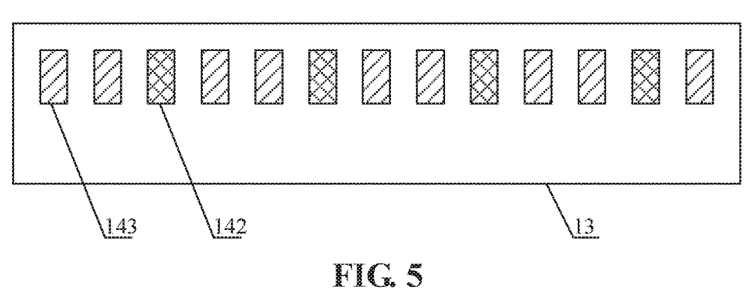
FIG. 5 is a top schematic view showing the structure of another implementation of arrangement of signal terminals of a display panel according to an embodiment.

FIG. 5 is a top schematic view showing the structure of another implementation of arrangement of signal terminals of a display panel according to an embodiment. As shown in FIG. 5, all the first signal terminals 142 are evenly arranged between all of the second signal terminals 143.

As shown in FIG. 5, all the first signal terminals 142 are evenly arranged between all of the second signal terminals 143 such that the numbers of the second signal terminals 143 provided between every two adjacent first signal terminals 142 are identical. In such an arrangement, the number of the first signal terminals 142 is less than that of all the second signal terminals 143, that is, the distribution of signal terminals provided in FIG. 5 is that all the first signal terminals 142 having a relatively small number of signal terminals are evenly arranged between the second signal terminals 143 having a relatively large number of signal terminals.

In the arrangement of the signal terminals provided in FIG. 5, the edge signal terminal from the type of signal terminals having a larger number of signal terminals can be moved towards the edge of the driver chip 13, so that a vertical distance between the edge signal terminal of the type of signal terminals having a larger number of signal terminals and an edge signal line connected to the edge signal terminal, i.e. the distance E as shown in FIG. 1A, can be decreased, and further the dimension of a non-display region occupied by the connection lines corresponding to the type of signal terminals having the larger number of signal terminals can be decreased in the longitudinal direction. Since the dimension of the frame in the longitudinal direction is determined by the dimension of the non-display region occupied by the connection lines corresponding to the type of signal terminals having the maximal number of signal terminals in the longitudinal direction, the dimension of the frame in the longitudinal direction can be decreased according to the implementation of the arrangement of the signal terminals provided in FIG. 5. In addition, as compared with the above embodiments, the advantage of the present embodiment lies in that the first signal terminals 142 are evenly arranged between all of the second signal terminals 143 such that a distance between the second signal terminals 143 is maximized. When the signal line are electrically connected to first signal terminals 142 and second signal terminals 143, the connection lines corresponding to every two adjacent first signal terminals 142 have a relative large distance therebetween, and the connection lines corresponding to every two adjacent second signal terminals 143 also have a relative larger distance therebetween, thereby simplifying the manufacturing process of the display panel.

Figure 6:
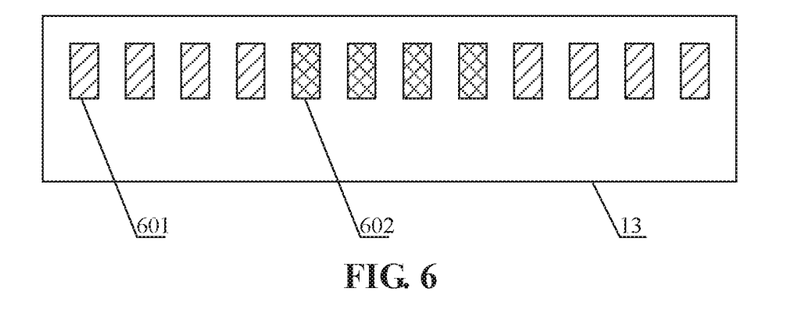
FIG. 6 is a top schematic view showing the structure of another implementation of arrangement of signal terminals of a display panel according to an embodiment.

FIG. 6 is a top schematic view showing the structure of another implementation of arrangement of signal terminals of a display panel according to an embodiment. As shown in FIG. 6, in at least two types of signal terminals, the signal terminals 601 of the same type of signal terminals having a maximal number of signal terminals are located at both ends of a driver chip.

As shown in FIG. 6, in at least two types of signal terminals, the signal terminals 601 from the type of signal terminals having a maximal number of signal terminals are located at both ends of the driver chip 13, other signal terminals are arranged in the middle region of the driver chip 13. According to the distribution manner of the signal terminals provided in FIG. 6, an edge signal terminal of the type of signal terminals having a maximal number of signal terminals can move towards an edge of the driver chip 13. Hence, the dimension of a non-display region occupied by the connection lines corresponding to the type of signal terminals having the maximal number of signal terminals can be decreased in the longitudinal direction. Since the dimension of the frame in the longitudinal direction is determined by the dimension of the non-display region occupied by the connection lines corresponding to the same type of signal terminals having the maximal number of signal terminals in the longitudinal direction, the dimension of the frame in the longitudinal direction can be reduced according to the implementation of the distribution of the signal terminals provided in FIG. 6.

It should be noted that the number of signal terminals can be any integer equal to or larger than 2. FIG. 6 only shows a case in which two types of signal terminals are provided. In some embodiments, other distribution manners of other types of signal terminals according to the distribution manner of the signal terminals provided in FIG. 6.

In the distribution manners of the signal terminals provided in FIGS. 2 to 6, the number of the signal terminals, the size of the signal terminals and a distance provided between any two signal terminals are only used to describe the distribution manner of the signal terminals, which is not limited herein. In the distribution manners of the signal terminals provided in FIGS. 2-6, the driver chip 13 is a surface mount device configuration, and the driver chip 13 can also a pin configuration.

In the display panel provided in FIGS. 1-6, the first signal line 112 may be a touch signal line. The second signal line 113 may be a display signal line. Accordingly, the first signal terminal 142 may be a touch signal terminal. the second signal terminal 143 may be a display signal terminal; the first connection line may be a touch connection line; the second connection line 123 may be a display connection line. The touch signal terminal is configured to apply a touch signal to the touch signal line; the display signal terminal is configured to apply a display signal to the display signal line.

It should be understood that in the display panel, the number of the display signal lines is larger than that of the touch signal lines, and accordingly the number of the display connection lines is larger than that of the touch connection lines. As a result, the dimension of the frame in the longitudinal direction is determined by the dimension of a non-display region occupied by the display connection lines in the longitudinal direction. In the above display panel, at least a part of touch signal terminals are arranged between the display signal terminals, thereby realizing the movement of the display signal terminal to the edge of the driver chip.

Hence, the dimension of the non-display region occupied by the display connection lines can be decreased in the longitudinal direction, and further the size of the frame can be decreased in the longitudinal direction.

According to the embodiments, at least two types of signal terminals of the display panel further includes any one of a clock signal terminal, a common voltage signal terminal, a triggering signal terminal, a resetting signal terminal or a deformation sensing signal terminal. The clock signal terminal is configured to apply a clock signal to a respective clock signal line; the common voltage signal terminal is configured to apply a common voltage signal to a respective common voltage; the trigger signal terminal is configured to apply a trigger signal to a respective trigger signal line; the reset signal terminal is configured to apply a reset signal to a respective reset signal line; and the deformation sensing signal terminal is configured to sense the deformation of the display panel.

In addition, in at least two types of connection lines, at least a part of a first type of connection lines and at least a part of a second type of connection lines can be alternately arranged separately, so that the distribution manner of the connection lines is consistent with the distribution manner of the signal terminals. Therefore, when the signal lines are electrically connected to the signal terminals through the connection lines, the signal lines can correspond to the signal terminals in a one-to-one relationship, thereby simplifying the manufacturing process of the display panel.

A In some embodiments, it should be understood that the display panel provided in the present disclosure may be a liquid crystal display panel or may be an organic light-emitting display panel.

Embodiment also provides a display device including the display panel provided in the Embodiments. The display device has an advantage the same to the advantage of the display panel provided in the above embodiments, which is not described herein. The display device can be a device with a display function, such as a mobile phone, a television set or a computer.

We claim:

1. A display panel, comprising:
   first signal lines;
   second signal lines;
   first connection lines;
   second connection lines; and
   a driver chip having n first signal terminals and m second signal terminals,
   wherein the n first signal terminals and m second signal terminals are aligned in a row in a first direction, two adjacent ones of the n first signal terminals are spaced apart by two or more of the m second signal terminals, and wherein n and m are positive integers,
   wherein the first signal lines are touch signal lines, the second signal lines are display signal lines, and a number of the display signal lines is larger than a number of the touch signal lines.

2. The display panel according to claim 1, wherein each of the n first signal terminals is connected to a respective one of the first signal lines via a respective one of the first connection lines, and each of the m second signal terminals is connected to a respective one of the second signal lines via a respective one of the second connection lines.

3. The display panel according to claim 1, wherein the first signal lines extend in a second direction, the second signal lines extend in the second direction, and the first connection lines and the second connection lines are polylines.

4. The display panel according to claim 3, wherein each of the first connection lines comprises a first straight part extending in the second direction and a second straight part inclined with respect to the second direction, each of the second connection lines comprises a third straight part extending in the second direction and a fourth straight part inclined with respect to the second direction.

5. The display panel according to claim 4, wherein lengths of the second straight parts of two adjacent first connection lines are different, and lengths of the fourth straight parts of two adjacent second connection lines are different from each other.

6. The display panel according to claim 4, wherein a length of the second straight part of one of the first connection lines is different from a length of the fourth straight part of one of the second connection lines adjacent to the one of the first connection lines.

7. The display panel according to claim 1, wherein the display panel is a liquid crystal display panel.

8. The display panel according to claim 1, wherein the display panel is an organic light-emitting display panel.

9. The display panel according to claim 1, wherein each of the n first signal terminals is connected to a respective one of the first signal lines via a respective one of the first connection lines, and each of the m second signal terminals is connected to a respective one of the second signal lines via a respective one of the second connection lines,
   wherein each of the n first signal terminals is configured to supply a touch signal to the respective one of the first signal lines, and each of the m second signal terminals is configured to supply a display signal to the respective one of the second signal lines.

10. The display panel according to claim 1, wherein n is less than m.

11. The display panel according to claim 10, wherein every two adjacent ones of the n first signal terminals are spaced apart by two of the m second signal terminals.

12. The display panel according to claim 10, wherein i ones of the m second signal terminals are ahead of the n first signal terminals in the row, and the n first signal terminals are followed by j ones of the m second signal terminals, wherein i and j are positive integers, and i+j<m−2.

13. The display panel according to claim 12, wherein i is greater than or equal to 3, and j is greater than or equal to 3.

14. The display panel according to claim 12, wherein every two adjacent ones of the n first signal terminals are spaced apart by two of the m second signal terminals.

15. The display panel according to claim 10, wherein the ith position to the jth position of the row are second signal terminals, and the n first signal terminals and (m+i−j−1) second signal terminals are alternately arranged in the first position to the (i−1)th position of the row and the (j+1)th position to the last position of the row.

16. The display panel according to claim 15, wherein in the first position to the (i−1)th position of the row, every two adjacent first signal terminals are spaced apart by a respective one second signal terminal; and in the (j+1)th position to the last position of the row, every two adjacent first signal terminals are spaced apart by a respective one second signal terminal.

17. A display panel, comprising:
   first signal lines;
   second signal lines;
   first connection lines;
   second connection lines; and a driver chip having n first signal terminals and m second signal terminals, wherein the n first signal terminals and m second signal terminals are aligned in a row in a first direction, two adjacent ones of the n first signal terminals are spaced apart by two or more of the m second signal terminals, and wherein n and m are positive integers, wherein at least two adjacent first connection lines each comprises a first straight part extending in the first direction and a second straight part inclined with respect to the first direction, and at least two adjacent second connection lines each comprises a third straight part extending in the first direction and a fourth straight part inclined with respect to the first direction, wherein lengths of the second straight parts of the two adjacent first connection lines are different, and lengths of the fourth straight parts of the two adjacent second connection lines are different.

18. A display panel, comprising:
first signal lines; second signal lines;
first connection lines;
second connection lines; and
a driver chip having n first signal terminals and m second signal terminals, wherein n and m are positive integers, and n is less than m, wherein the n first signal terminals and m second signal terminals are aligned in a row in a first direction, the m second signal terminals are divided into a first group, a second group and a third group, the first group is entirely ahead of the second group and the n first signal terminals, the second group and the n first signal terminals are entirely ahead of the third group, and two adjacent ones of the n first signal terminals are spaced apart by one or more second signal terminals in the second group; and wherein the first signal lines are touch signal lines, the second signal lines are display signal lines, and a number of the display signal lines is larger than a number of the touch signal lines.

19. The display panel according to claim 18, wherein the first signal lines are configured to convey a first signal, the second signal lines are configured to convey a second signal, and the first signal and the second signal are different in kind.

* * * * *